US009054219B1

(12) United States Patent
Hoffmann et al.

(10) Patent No.: US 9,054,219 B1
(45) Date of Patent: Jun. 9, 2015

(54) SEMICONDUCTOR DEVICES HAVING FIN STRUCTURES AND FABRICATION METHODS THEREOF

(71) Applicant: SuVolta, Inc., Los Gatos, CA (US)

(72) Inventors: Thomas Hoffmann, Los Gatos, CA (US); Scott E. Thompson, Gainesville, FL (US)

(73) Assignee: Mie Fujitsu Semiconductor Limited, Kuwana (JP)

( * ) Notice: Subject to any disclaimer, the term of this patent is extended or adjusted under 35 U.S.C. 154(b) by 0 days.

(21) Appl. No.: 14/173,570

(22) Filed: Feb. 5, 2014

Related U.S. Application Data

(63) Continuation of application No. PCT/US2012/049531, filed on Aug. 3, 2012.

(60) Provisional application No. 61/515,452, filed on Aug. 5, 2011.

(51) Int. Cl.
| | |
|---|---|
| *H01L 21/00* | (2006.01) |
| *H01L 21/84* | (2006.01) |
| *H01L 21/8234* | (2006.01) |
| *H01L 21/336* | (2006.01) |
| *H01L 21/8238* | (2006.01) |

(52) U.S. Cl.
CPC .............................. *H01L 21/823828* (2013.01)

(58) Field of Classification Search
USPC ................. 438/154, 275, 283, 308, 481, 527; 257/E21.63, E21.409
See application file for complete search history.

(56) References Cited

U.S. PATENT DOCUMENTS

| | | | |
|---|---|---|---|
| 3,958,266 | A | 5/1976 | Athanas |
| 4,000,504 | A | 12/1976 | Berger |
| 4,021,835 | A | 5/1977 | Etoh et al. |
| 4,242,691 | A | 12/1980 | Kotani et al. |

(Continued)

FOREIGN PATENT DOCUMENTS

| | | |
|---|---|---|
| EP | 0274278 | 7/1988 |
| EP | 0312237 | 4/1989 |

(Continued)

OTHER PUBLICATIONS

International Search Report and Written Opinion mailed Mar. 4, 2013, in corresponding application No. PCT/US2012/049531.

(Continued)

*Primary Examiner* — Mohsen Ahmadi
(74) *Attorney, Agent, or Firm* — Baker Botts L.L.P.

(57) ABSTRACT

A method of fabricating semiconductor devices includes providing a semiconducting substrate. The method also includes defining a heavily doped region at a surface of the semiconducting substrate in at least one area of the semiconducting substrate, where the heavily doped region includes a heavily doped layer having a doping concentration greater than a doping concentration of the semiconducting substrate. The method also includes forming an additional layer of semiconductor material on the semiconducting substrate, the additional layer comprising a substantially undoped layer. The method further includes applying a first removal process to the semiconducting substrate to define an unetched portion and an etched portion, where the unetched portion defines a fin structure, and the etched portion extends through the additional layer, and then isolating the fin structure from other structures.

14 Claims, 7 Drawing Sheets

(56) References Cited

U.S. PATENT DOCUMENTS

| | | |
|---|---|---|
| 4,276,095 A | 6/1981 | Beilstein, Jr. et al. |
| 4,315,781 A | 2/1982 | Henderson |
| 4,518,926 A | 5/1985 | Swanson |
| 4,559,091 A | 12/1985 | Allen et al. |
| 4,578,128 A | 3/1986 | Mundt et al. |
| 4,617,066 A | 10/1986 | Vasudev |
| 4,662,061 A | 5/1987 | Malhi |
| 4,761,384 A | 8/1988 | Neppl et al. |
| 4,780,748 A | 10/1988 | Cunningham et al. |
| 4,819,043 A | 4/1989 | Yazawa et al. |
| 4,885,477 A | 12/1989 | Bird et al. |
| 4,908,681 A | 3/1990 | Nishida et al. |
| 4,945,254 A | 7/1990 | Robbins |
| 4,956,311 A | 9/1990 | Liou et al. |
| 5,034,337 A | 7/1991 | Mosher et al. |
| 5,144,378 A | 9/1992 | Hikosaka |
| 5,156,989 A | 10/1992 | Williams et al. |
| 5,156,990 A | 10/1992 | Mitchell |
| 5,166,765 A | 11/1992 | Lee et al. |
| 5,208,473 A | 5/1993 | Komori et al. |
| 5,294,821 A | 3/1994 | Iwamatsu |
| 5,298,763 A | 3/1994 | Shen et al. |
| 5,369,288 A | 11/1994 | Usuki |
| 5,373,186 A | 12/1994 | Schubert et al. |
| 5,384,476 A | 1/1995 | Nishizawa et al. |
| 5,426,328 A | 6/1995 | Yilmaz et al. |
| 5,444,008 A | 8/1995 | Han et al. |
| 5,552,332 A | 9/1996 | Tseng et al. |
| 5,559,368 A | 9/1996 | Hu et al. |
| 5,608,253 A | 3/1997 | Liu et al. |
| 5,622,880 A | 4/1997 | Burr et al. |
| 5,624,863 A | 4/1997 | Helm et al. |
| 5,625,568 A | 4/1997 | Edwards et al. |
| 5,641,980 A | 6/1997 | Yamaguchi et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,726,562 A | 3/1998 | Mizuno |
| 5,731,626 A | 3/1998 | Eaglesham et al. |
| 5,736,419 A | 4/1998 | Naem |
| 5,753,555 A | 5/1998 | Hada |
| 5,754,826 A | 5/1998 | Gamal et al. |
| 5,756,365 A | 5/1998 | Kakumu |
| 5,763,921 A | 6/1998 | Okumura et al. |
| 5,780,899 A | 7/1998 | Hu et al. |
| 5,847,419 A | 12/1998 | Imai et al. |
| 5,856,003 A | 1/1999 | Chiu |
| 5,861,334 A | 1/1999 | Rho |
| 5,877,049 A | 3/1999 | Liu et al. |
| 5,885,876 A | 3/1999 | Dennen |
| 5,889,315 A | 3/1999 | Farrenkopf et al. |
| 5,895,954 A | 4/1999 | Yasumura et al. |
| 5,899,714 A | 5/1999 | Farrenkopf et al. |
| 5,918,129 A | 6/1999 | Fulford, Jr. et al. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin et al. |
| 5,985,705 A | 11/1999 | Seliskar |
| 5,989,963 A | 11/1999 | Luning et al. |
| 6,001,695 A | 12/1999 | Wu |
| 6,020,227 A | 2/2000 | Bulucea |
| 6,043,139 A | 3/2000 | Eaglesham et al. |
| 6,060,345 A | 5/2000 | Hause et al. |
| 6,060,364 A | 5/2000 | Maszara et al. |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,153,920 A | 11/2000 | Gossmann et al. |
| 6,157,073 A | 12/2000 | Lehongres |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,198,157 B1 | 3/2001 | Ishida et al. |
| 6,218,892 B1 | 4/2001 | Soumyanath et al. |
| 6,218,895 B1 | 4/2001 | De et al. |
| 6,221,724 B1 | 4/2001 | Yu et al. |
| 6,229,188 B1 | 5/2001 | Aoki et al. |
| 6,232,164 B1 | 5/2001 | Tsai et al. |
| 6,235,597 B1 | 5/2001 | Miles |
| 6,245,618 B1 | 6/2001 | An et al. |
| 6,268,640 B1 | 7/2001 | Park et al. |
| 6,271,070 B2 | 8/2001 | Kotani et al. |
| 6,271,551 B1 | 8/2001 | Schmitz et al. |
| 6,288,429 B1 | 9/2001 | Iwata et al. |
| 6,297,132 B1 | 10/2001 | Zhang et al. |
| 6,300,177 B1 | 10/2001 | Sundaresan et al. |
| 6,313,489 B1 | 11/2001 | Letavic et al. |
| 6,319,799 B1 | 11/2001 | Ouyang et al. |
| 6,320,222 B1 | 11/2001 | Forbes et al. |
| 6,323,525 B1 | 11/2001 | Noguchi et al. |
| 6,326,666 B1 | 12/2001 | Bernstein et al. |
| 6,335,233 B1 | 1/2002 | Cho et al. |
| 6,358,806 B1 | 3/2002 | Puchner |
| 6,380,019 B1 | 4/2002 | Yu et al. |
| 6,391,752 B1 | 5/2002 | Colinge et al. |
| 6,426,260 B1 | 7/2002 | Hshieh |
| 6,426,279 B1 | 7/2002 | Huster et al. |
| 6,432,754 B1 | 8/2002 | Assaderaghi et al. |
| 6,444,550 B1 | 9/2002 | Hao et al. |
| 6,444,551 B1 | 9/2002 | Ku et al. |
| 6,449,749 B1 | 9/2002 | Stine |
| 6,461,920 B1 | 10/2002 | Shirahata |
| 6,461,928 B2 | 10/2002 | Rodder |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,503,805 B2 | 1/2003 | Wang et al. |
| 6,506,640 B1 | 1/2003 | Ishida et al. |
| 6,518,623 B1 | 2/2003 | Oda et al. |
| 6,521,470 B1 | 2/2003 | Lin et al. |
| 6,534,373 B1 | 3/2003 | Yu |
| 6,541,328 B2 | 4/2003 | Whang et al. |
| 6,541,829 B2 | 4/2003 | Nishinohara et al. |
| 6,548,842 B1 | 4/2003 | Bulucea et al. |
| 6,551,885 B1 | 4/2003 | Yu |
| 6,552,377 B1 | 4/2003 | Yu |
| 6,573,129 B2 | 6/2003 | Hoke et al. |
| 6,576,535 B2 | 6/2003 | Drobny et al. |
| 6,600,200 B1 | 7/2003 | Lustig et al. |
| 6,620,671 B1 | 9/2003 | Wang et al. |
| 6,624,488 B1 | 9/2003 | Kim |
| 6,627,473 B1 | 9/2003 | Oikawa et al. |
| 6,630,710 B1 | 10/2003 | Augusto |
| 6,660,605 B1 | 12/2003 | Liu |
| 6,662,350 B2 | 12/2003 | Fried et al. |
| 6,667,200 B2 | 12/2003 | Sohn et al. |
| 6,670,260 B1 | 12/2003 | Yu et al. |
| 6,693,333 B1 | 2/2004 | Yu |
| 6,730,568 B2 | 5/2004 | Sohn |
| 6,737,724 B2 | 5/2004 | Hieda et al. |
| 6,743,291 B2 | 6/2004 | Ang et al. |
| 6,743,684 B2 | 6/2004 | Liu |
| 6,751,519 B1 | 6/2004 | Satya et al. |
| 6,753,230 B2 | 6/2004 | Sohn et al. |
| 6,760,900 B2 | 7/2004 | Rategh et al. |
| 6,770,944 B2 | 8/2004 | Nishinohara et al. |
| 6,787,424 B1 | 9/2004 | Yu |
| 6,797,553 B2 | 9/2004 | Adkisson et al. |
| 6,797,602 B1 | 9/2004 | Kluth et al. |
| 6,797,994 B1 | 9/2004 | Hoke et al. |
| 6,808,004 B2 | 10/2004 | Kamm et al. |

(56) References Cited

U.S. PATENT DOCUMENTS

| | | |
|---|---|---|
| 6,808,994 B1 | 10/2004 | Wang |
| 6,813,750 B2 | 11/2004 | Usami et al. |
| 6,821,825 B2 | 11/2004 | Todd et al. |
| 6,821,852 B2 | 11/2004 | Rhodes |
| 6,822,297 B2 | 11/2004 | Nandakumar et al. |
| 6,831,292 B2 | 12/2004 | Currie et al. |
| 6,835,639 B2 | 12/2004 | Rotondaro et al. |
| 6,852,602 B2 | 2/2005 | Kanzawa et al. |
| 6,852,603 B2 | 2/2005 | Chakravarthi et al. |
| 6,881,641 B2 | 4/2005 | Wieczorek et al. |
| 6,881,987 B2 | 4/2005 | Sohn |
| 6,891,439 B2 | 5/2005 | Jaehne et al. |
| 6,893,947 B2 | 5/2005 | Martinez et al. |
| 6,900,519 B2 | 5/2005 | Cantell et al. |
| 6,901,564 B2 | 5/2005 | Stine et al. |
| 6,916,698 B2 | 7/2005 | Mocuta et al. |
| 6,917,237 B1 | 7/2005 | Tschanz et al. |
| 6,927,463 B2 | 8/2005 | Iwata et al. |
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,957,163 B2 | 10/2005 | Ando |
| 6,963,090 B2 | 11/2005 | Passlack et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,513 B2 | 8/2006 | Bard et al. |
| 7,089,515 B2 | 8/2006 | Hanafi et al. |
| 7,091,093 B1 | 8/2006 | Noda et al. |
| 7,105,399 B1 | 9/2006 | Dakshina-Murthy et al. |
| 7,109,099 B2 | 9/2006 | Tan et al. |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch et al. |
| 7,169,675 B2 | 1/2007 | Tan et al. |
| 7,170,120 B2 | 1/2007 | Datta et al. |
| 7,176,137 B2 | 2/2007 | Perng et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,208,354 B2 | 4/2007 | Bauer |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,230,680 B2 | 6/2007 | Fujisawa et al. |
| 7,235,822 B2 | 6/2007 | Li |
| 7,256,639 B1 | 8/2007 | Koniaris et al. |
| 7,259,428 B2 | 8/2007 | Inaba |
| 7,260,562 B2 | 8/2007 | Czajkowski et al. |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,348,629 B2 | 3/2008 | Chu et al. |
| 7,354,833 B2 | 4/2008 | Liaw |
| 7,380,225 B2 | 5/2008 | Joshi et al. |
| 7,398,497 B2 | 7/2008 | Sato et al. |
| 7,402,207 B1 | 7/2008 | Besser et al. |
| 7,402,872 B2 | 7/2008 | Murthy et al. |
| 7,416,605 B2 | 8/2008 | Zollner et al. |
| 7,427,788 B2 | 9/2008 | Li et al. |
| 7,442,971 B2 | 10/2008 | Wirbeleit et al. |
| 7,449,733 B2 | 11/2008 | Inaba et al. |
| 7,462,908 B2 | 12/2008 | Bol et al. |
| 7,469,164 B2 | 12/2008 | Du-Nour |
| 7,470,593 B2 | 12/2008 | Rouh et al. |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,498,637 B2 | 3/2009 | Yamaoka et al. |
| 7,501,324 B2 | 3/2009 | Babcock et al. |
| 7,503,020 B2 | 3/2009 | Allen et al. |
| 7,507,999 B2 | 3/2009 | Kusumoto et al. |
| 7,514,766 B2 | 4/2009 | Yoshida |
| 7,521,323 B2 | 4/2009 | Surdeanu et al. |
| 7,531,393 B2 | 5/2009 | Doyle et al. |
| 7,531,836 B2 | 5/2009 | Liu et al. |
| 7,538,364 B2 | 5/2009 | Twynam |
| 7,538,412 B2 | 5/2009 | Schulze et al. |
| 7,562,233 B1 | 7/2009 | Sheng et al. |
| 7,564,105 B2 | 7/2009 | Chi et al. |
| 7,566,600 B2 | 7/2009 | Mouli |
| 7,569,456 B2 | 8/2009 | Ko et al. |
| 7,586,322 B1 | 9/2009 | Xu et al. |
| 7,592,241 B2 | 9/2009 | Takao |
| 7,595,243 B1 | 9/2009 | Bulucea et al. |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,638,380 B2 | 12/2009 | Pearce |
| 7,642,140 B2 | 1/2010 | Bae et al. |
| 7,644,377 B1 | 1/2010 | Saxe et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,673,273 B2 | 3/2010 | Madurawe et al. |
| 7,675,126 B2 | 3/2010 | Cho |
| 7,675,317 B2 | 3/2010 | Perisetty |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,737,472 B2 | 6/2010 | Kondo et al. |
| 7,741,138 B2 | 6/2010 | Cho |
| 7,741,200 B2 | 6/2010 | Cho et al. |
| 7,745,270 B2 | 6/2010 | Shah et al. |
| 7,750,374 B2 | 7/2010 | Capasso et al. |
| 7,750,381 B2 | 7/2010 | Hokazono et al. |
| 7,750,405 B2 | 7/2010 | Nowak |
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,759,714 B2 | 7/2010 | Itoh et al. |
| 7,761,820 B2 | 7/2010 | Berger et al. |
| 7,795,677 B2 | 9/2010 | Bangsaruntip et al. |
| 7,808,045 B2 | 10/2010 | Kawahara et al. |
| 7,808,410 B2 | 10/2010 | Kim et al. |
| 7,811,873 B2 | 10/2010 | Mochizuki |

(56) References Cited

U.S. PATENT DOCUMENTS

| | | |
|---|---|---|
| 7,811,881 B2 | 10/2010 | Cheng et al. |
| 7,818,702 B2 | 10/2010 | Mandelman et al. |
| 7,821,066 B2 | 10/2010 | Lebby et al. |
| 7,829,402 B2 | 11/2010 | Matocha et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,941,776 B2 | 5/2011 | Majumder et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,004,024 B2 | 8/2011 | Furukawa et al. |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,286,180 B2 | 10/2012 | Foo |
| 8,288,798 B2 | 10/2012 | Passlack |
| 8,299,562 B2 | 10/2012 | Li et al. |
| 8,324,059 B2 | 12/2012 | Guo et al. |
| 2001/0014495 A1 | 8/2001 | Yu |
| 2002/0033511 A1 | 3/2002 | Babcock et al. |
| 2002/0042184 A1 | 4/2002 | Nandakumar et al. |
| 2003/0006415 A1 | 1/2003 | Yokogawa et al. |
| 2003/0047763 A1 | 3/2003 | Hieda et al. |
| 2003/0122203 A1 | 7/2003 | Nishinohara et al. |
| 2003/0173626 A1 | 9/2003 | Burr |
| 2003/0183856 A1 | 10/2003 | Wieczorek et al. |
| 2003/0215992 A1 | 11/2003 | Sohn et al. |
| 2004/0053457 A1 | 3/2004 | Sohn |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2005/0056877 A1 | 3/2005 | Rueckes et al. |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0017100 A1 | 1/2006 | Bol et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0091481 A1 | 5/2006 | Li et al. |
| 2006/0154428 A1 | 7/2006 | Dokumaci |
| 2006/0157794 A1 | 7/2006 | Doyle et al. |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2007/0004107 A1 | 1/2007 | Lee et al. |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0001171 A1 | 1/2008 | Tezuka et al. |
| 2008/0067589 A1 | 3/2008 | Ito et al. |
| 2008/0108208 A1 | 5/2008 | Arevalo et al. |
| 2008/0138953 A1 | 6/2008 | Challa et al. |
| 2008/0169493 A1 | 7/2008 | Lee et al. |
| 2008/0169516 A1 | 7/2008 | Chung |
| 2008/0197439 A1 | 8/2008 | Goerlach et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0003105 A1 | 1/2009 | Itoh et al. |
| 2009/0057746 A1 | 3/2009 | Sugll et al. |
| 2009/0057762 A1 | 3/2009 | Bangsaruntip et al. |
| 2009/0108350 A1 | 4/2009 | Cai et al. |
| 2009/0121298 A1 | 5/2009 | Furukawa et al. |
| 2009/0134468 A1 | 5/2009 | Tsuchiya et al. |
| 2009/0224319 A1 | 9/2009 | Kohli |
| 2009/0302388 A1 | 12/2009 | Cai et al. |
| 2009/0309140 A1 | 12/2009 | Khamankar et al. |
| 2009/0311837 A1 | 12/2009 | Kapoor |

(56) References Cited

U.S. PATENT DOCUMENTS

| | | | |
|---|---|---|---|
| 2009/0321849 | A1 | 12/2009 | Miyamura et al. |
| 2010/0012988 | A1 | 1/2010 | Yang et al. |
| 2010/0038724 | A1 | 2/2010 | Anderson et al. |
| 2010/0055886 | A1 | 3/2010 | Izumida et al. |
| 2010/0100856 | A1 | 4/2010 | Mittal |
| 2010/0148153 | A1 | 6/2010 | Hudait et al. |
| 2010/0149854 | A1 | 6/2010 | Vora |
| 2010/0187641 | A1 | 7/2010 | Zhu et al. |
| 2010/0207182 | A1 | 8/2010 | Paschal |
| 2010/0270600 | A1 | 10/2010 | Inukai et al. |
| 2011/0059588 | A1 | 3/2011 | Kang |
| 2011/0073961 | A1 | 3/2011 | Dennard et al. |
| 2011/0074498 | A1 | 3/2011 | Thompson et al. |
| 2011/0079860 | A1 | 4/2011 | Verhulst |
| 2011/0079861 | A1 | 4/2011 | Shifren et al. |
| 2011/0095811 | A1 | 4/2011 | Chi et al. |
| 2011/0147828 | A1 | 6/2011 | Murthy et al. |
| 2011/0169082 | A1 | 7/2011 | Zhu et al. |
| 2011/0175170 | A1 | 7/2011 | Wang et al. |
| 2011/0180880 | A1 | 7/2011 | Chudzik et al. |
| 2011/0193164 | A1 | 8/2011 | Zhu |
| 2011/0212590 | A1 | 9/2011 | Wu et al. |
| 2011/0230039 | A1 | 9/2011 | Mowry et al. |
| 2011/0242921 | A1 | 10/2011 | Tran et al. |
| 2011/0248352 | A1 | 10/2011 | Shifren et al. |
| 2011/0294278 | A1 | 12/2011 | Eguchi et al. |
| 2011/0309447 | A1 | 12/2011 | Arghavani et al. |
| 2012/0021594 | A1 | 1/2012 | Gurtej et al. |
| 2012/0034745 | A1 | 2/2012 | Colombeau et al. |
| 2012/0049282 | A1* | 3/2012 | Chen et al. ............... 257/347 |
| 2012/0056275 | A1 | 3/2012 | Cai et al. |
| 2012/0065920 | A1 | 3/2012 | Nagumo et al. |
| 2012/0108050 | A1 | 5/2012 | Chen et al. |
| 2012/0132998 | A1 | 5/2012 | Kwon et al. |
| 2012/0138953 | A1 | 6/2012 | Cai et al. |
| 2012/0146155 | A1 | 6/2012 | Hoentschel et al. |
| 2012/0167025 | A1 | 6/2012 | Gillespie et al. |
| 2012/0187491 | A1 | 7/2012 | Zhu et al. |
| 2012/0190177 | A1 | 7/2012 | Kim et al. |
| 2012/0223363 | A1 | 9/2012 | Kronholz et al. |
| 2012/0292672 | A1* | 11/2012 | Cho ....................... 257/288 |

FOREIGN PATENT DOCUMENTS

| | | |
|---|---|---|
| EP | 0531621 | 3/1993 |
| EP | 0683515 | 11/1995 |
| EP | 0889502 | 1/1999 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | 2004087671 | 3/2004 |
| KR | 10-2005-0099328 A | 10/2005 |
| KR | 794094 | 1/2008 |
| WO | WO2011/062788 | 5/2011 |

OTHER PUBLICATIONS

Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.

Samsudin, K et al., "Integrating Intrinsic Parameter Fluctuation Description into BSIMSOI to Forecast sub-15nm UTB SOI based 6T SRAM Operation", Solid-State Electronics (50), pp. 86-93 2006.

Wong, II et al., "Nanoscale CMOS", Proceedings of the IEEE, Vo. 87, No. 4, pp. 537-570, Apr. 1999.

Abiko, H et al., "A Channel Engineering Combined with Channel Epitaxy Optimization and TED Suppression for 0.15 μm n-n Gate CMOS Technology", 1995 Symposium on VLSI Technology Digest of Technical Papers, pp. 23-24, 1995.

Chau, Ret al., "A 50nm Depleted-Substrate CMOS Transistor (DST)", Electron Device Meeting 2001, IEDM Technical Digest, IEEE International, pp. 29.1.1-29.1.4, 2001.

Ducroquet, F ct al. "Fully Depleted Silicon-On-Insulator nMOSFETs with Tensile Strained High Carbon Content $Si_{1-y}C_y$ Channel", ECS 210th Meeting, Abstract 1033, 2006.

Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961, 2006.

Goesele, U et al., Diffusion Engineering by Carbon in Silicon, Mat. Res. Soc. Symp. vol. 610, 2000.

Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113, 2008.

Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.

Holland, OW and Thomas, DK "A Method to Improve Activation of Implanted Dopants in SiC", Oak Ridge National Laboratory, Oak Ridge, TN, 2001.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462, 1996.

Lavéant, P. "Incorporation, Diffusion and Agglomeration of Carbon in Silicon", Solid State Phenomena, vols. 82-84, pp. 189-194, 2002.

Noda, K et al., "A 0.1-μm Delta-Doped MOSFET Fabricated with Post-Low-Energy Implanting Selective Epitaxy" IEEE Transactions on Electron Devices, vol. 45, No. 4, pp. 809-814, Apr. 1998.

Ohguro, T et al., "An 0.18-μm CMOS for Mixed Digital and Analog Aplications with Zero-Volt-Vth Epitaxial-Channel MOSFET's", IEEE Transactions on Electron Devices, vol. 46, No. 7, pp. 1378-1383, Jul. 1999.

Pinacho, R et al., "Carbon in Silicon: Modeling of Diffusion and Clustering Mechanisms", Journal of Applied Physics, vol. 92, No. 3, pp. 1582-1588, Aug. 2002.

Robertson, LS et al., "The Effect of Impurities on Diffusion and Activation of Ion Implanted Boron in Silicon", Mat. Res. Soc. Symp. vol. 610, 2000.

Scholz, R et al., "Carbon-Induced Undersaturation of Silicon Self-interstitials", Appl. Phys. Lett. 72(2), pp. 200-202, Jan. 1998.

Scholz, RF et al., "The Contribution of Vacancies to Carbon Out-Diffusion in Silicon", Appl. Phys. Lett., vol. 74, No. 3, pp. 392-394, Jan. 1999.

Stolk, PA et al., "Physical Mechanisms of Transient Enhanced Dopant Diffusion in Ion-Implanted Silicon", J. Appl. Phys. 81(9), pp. 6031-6050, May 1997.

Thompson, S et al., "MOS Scaling: Transistor Challenges for the 21st Century", Intel Technology Journal Q3' 1998, pp. 1-19, 1998.

Wann, C. et al., "Channel Profile Optimization and Device Design for Low-Power High-Performance Dynamic-Threshold MOSFET", IEDM 96, pp. 113-116, 1996.

Werner, P et al., "Carbon Diffusion in Silicon", Applied Physics Letters, vol. 73, No. 17, pp. 2465-2467, Oct. 1998.

Yan, Ran-Hong et al., "Scaling the Si MOSFET: From Bulk to SOI to Bulk", IEEE Transactions on Electron Devices, vol. 39, No. 7, Jul. 1992.

Banerjee, et al. "Compensating Non-Optical Effects using Electrically-Driven Optical Proximity Correction", Proc. of SPIE vol. 7275 72750E, 2009.

Cheng, et al. "Extremely Thin SOI (ETSOI) CMOS with Record Low Variability for Low Power System-on-Chip Applications", Electron Devices Meeting (IEDM), Dec. 2009.

Cheng, et al. "Fully Depleted Extremely Thin SOI Technology Fabricated by a Novel Integration Scheme Feturing Implant-Free, Zero-Silicon-Loss, and Faceted Raised Source/Drain", Symposium on VLSI Technology Digest of Technical Papers, pp. 212-213, 2009.

(56) References Cited

OTHER PUBLICATIONS

Drennan, et al. "Implications of Proximity Effects for Analog Design", Custom Integrated Circuits Conference, pp. 169-176, Sep. 2006.

Hook, et al. "Lateral Ion Implant Straggle and Mask Proximity Effect", IEEE Transactions on Electron Devices, vol. 50, No. 9, pp. 1946-1951, Sep. 2003.

Hori, et al., "A 0.1 μm CMOS with a Step Channel Profile Formed by Ultra High Vacuum CVD and In-Situ Doped Ions", Proceedsing of the International Electron Devices Meeting, New York, IEEE, US, pp. 909-911, Dec. 5, 1993.

Matshuashi, et al. "High-Performance Double-Layer Epitaxial-Channel PMOSFET Compatible with a Single Gate CMOSFET", Symposium on VLSI Technology Digest of Technical Papers, pp. 36-37, 1996.

Shao, et al., "Boron Diffusion in Silicon: The Anomalies and Control by Point Defect Engineering", Materials Science and Engineering R: Reports, vol. 42, No. 3-4, pp. 65-114, Nov. 1, 2003, Nov. 2012.

Sheu, et al. "Modeling the Well-Edge Proximity Effect in Highly Scaled MOSFETs", IEEE Transactions on Electron Devices, vol. 53, No. 11, pp. 2792-2798, Nov. 2006.

\* cited by examiner

SEMICONDUCTOR DEVICES HAVING FIN STRUCTURES AND FABRICATION METHODS THEREOF

CROSS-REFERENCE TO RELATED APPLICATIONS

This application is a continuation, under 35 U.S.C. 111, and claims priority to International Patent Application No. PCT/US2012/049531, filed Aug. 3, 2012 and entitled SEMICONDUCTOR DEVICES HAVING FIN STRUCTURES AND FABRICATION METHODS THEREOF, which claims priority to U.S. Provisional Patent Application No. 61/515,452, filed Aug. 5, 2011 and SEMICONDUCTOR DEVICES HAVING FIN STRUCTURES AND FABRICATION METHODS THEREOF, both of which are herein incorporated by reference in their entirety.

FIELD

The present disclosure relates, in general, to semiconductor devices and, more particularly, to semiconductor devices that include fin structures as well as an integration scheme to incorporate planar transistors on the same substrate as fin-based transistors.

BACKGROUND

As the semiconductor industry looks toward the 22 nm technology node and beyond, some manufacturers are considering a transition from planar CMOS transistors to the three-dimensional (3D) FinFET device architectures. In contrast to the gate in a planar transistor, which sits above the channel, the gate of a FinFET wraps around the channel, providing electrostatic control from multiple sides. Relative to planar transistors, such FinFETs offer improved channel control and, therefore, reduced short channel effects. Thanks to its intrinsically superior electrostatics control, the device electrostatics of FinFETs are improved as the width of the devices (Fin) is aggressively scaled (typically around 10-15 nm for sub-22 nm nodes applications). This is a result of the so-called "double gate" field effect, and can be quantified by significant DIBL reduction at small gate lengths ($L_g$), as the fin width ($W_{fin}$) reduces.

For the specific integration of FinFET on Bulk Silicon (Bulk-FinFET), the use of a "ground plane" right underneath the Si Fin has been studied. This ground plane is provided to prevent a potential leakage path between source and drain, in any regions which are low doped and not under direct control of the gate. In conventional Bulk-FinFETs, the ground plane is formed via implantation of a doped layer at an energy sufficiently high to cause the dopants to tunnel through the vertical length of the substrate and form the ground plane in the area of the well. The ground plane formation step is done after isolation features are formed. However, due to multiple factors (e.g., finite gradient of dopant profiles as-implanted, WPE, and backscattering from implantation into the isolation oxide layers), the Si fin can be unintentionally doped. The unintentional doping can degrade electrical performance, manifesting in matching issues (due to Random Dopant Fluctuation) or drive current variations (due to mobility loss from impurity scattering).

Moreover, in the case where this ground plane implant is performed after fin formation, any variation in the actual fin height will translate into a change of dopants position with respect to the top of the Fin. Therefore, the effective (or electrical) fin height of the device varies as well. Worst yet, the ground plane may not be properly formed. The variations in fin height are not only due to variations in process conditions, but also due to loading effects and other pattern dependencies. These variations will impact directly the key figures of merit of the devices (gate capacitance and drive current), directly proportional to the device effective width. As a result of such limitations, manufacturers are also considering utilizing SOI-FinFET device architectures, which eliminate the need for the heavily doped ground plane by simply providing Si fins on top of an insulator.

However, SOI-FinFET devices are not without issues. For example, one significant issue is the inability to provide an adequate backside substrate contact to fix a body voltage for the devices. This can lead to odd device characteristics, such as abrupt increases in current or a history effect which can alter threshold voltages (Vt) over time. Another significant issue is that the cost of an SOI substrate is prohibitive compared to bulk silicon.

BRIEF DESCRIPTION OF THE DRAWINGS

For a more complete understanding of the embodiments and their advantages, reference is now made to the following descriptions, taken in conjunction with the accompanying drawings, in which.

DETAILED DESCRIPTION

The embodiments are described with reference to the attached figures, wherein like reference numerals are used throughout the figures to designate similar or equivalent elements. The figures are not drawn to scale and they are provided merely to illustrate the embodiments. Several aspects of embodiments are described below with reference to example applications for illustration. It should be understood that numerous specific details, relationships, and methods are set forth. One having ordinary skill in the relevant art, will readily recognize that the invention can be practiced without one or more of the specific details or with other methods. In other instances, well-known structures or operations are not shown in detail to avoid obscuring the embodiments. The present invention is not limited by the illustrated ordering of acts or events, as some acts may occur in different orders and/or concurrently with other acts or events. Furthermore, not all illustrated acts or events are required to implement a methodology in accordance with the present invention.

The various embodiments provide a Bulk-FinFET device architecture that limits or eliminates both the amount of undesired fin doping and effective fin height variations to render the fin substantially undoped. to thereby reduce the degree of variation in threshold voltage arising from random dopant fluctuation in the fins. In particular, the various embodiments provide an integration scheme consisting of, prior to the isolation and fin formation modules, (1) forming the wells and heavily doped layers in a surface of a substrate via implants or other doping techniques; (2) growing an undoped epitaxial layer (epi-layer) on the substrate after forming the heavily doped region; and (3) patterning the epi-layer to define the fins. Thereafter, the fins are then used to form FinFET devices.

The integration scheme described above provides several advantages of SOI-FinFETs, but in a Bulk-FinFET structure. First, a truly undoped fin on a highly doped layer can be formed since no channel implantations are performed subsequent to the formation of the epi-layer. As a result, improvements in electrical characteristics, such as improved matching characteristics and higher mobility from less impurity scattering, are possible.

Second, this integration scheme enables the matching coefficient of Bulk-FinFET to reach ~1.0-1.2 mV/um, closely matching that reported for undoped SOI-FinFET devices. Further, global uniformity of the electrical performance is improved through a decoupling of the effective (or electrical) fin height from variations in etch and implant processes. Rather, fin height is primarily instead set by the epitaxial film thickness, for which uniformities of 0.1% or better are achievable. For example, for a silicon epi-layer of 30-40 nm, the epi-layer thickness wafer uniformity can be within +/−1 nm (1 sigma), which is much tighter than the uniformity achievable for the physical fin height via the conventional combination of etch processes and implant processes.

Other possible benefits include enhanced threshold voltage (Vth) tuning sensitivity by ground plane concentration change and enhanced body coefficient. Further, since no halo implantation is required and the well/ground well implantation is performed prior to STI, the integration scheme is also expected to reduce Well Proximity Effects.

Figure 1:
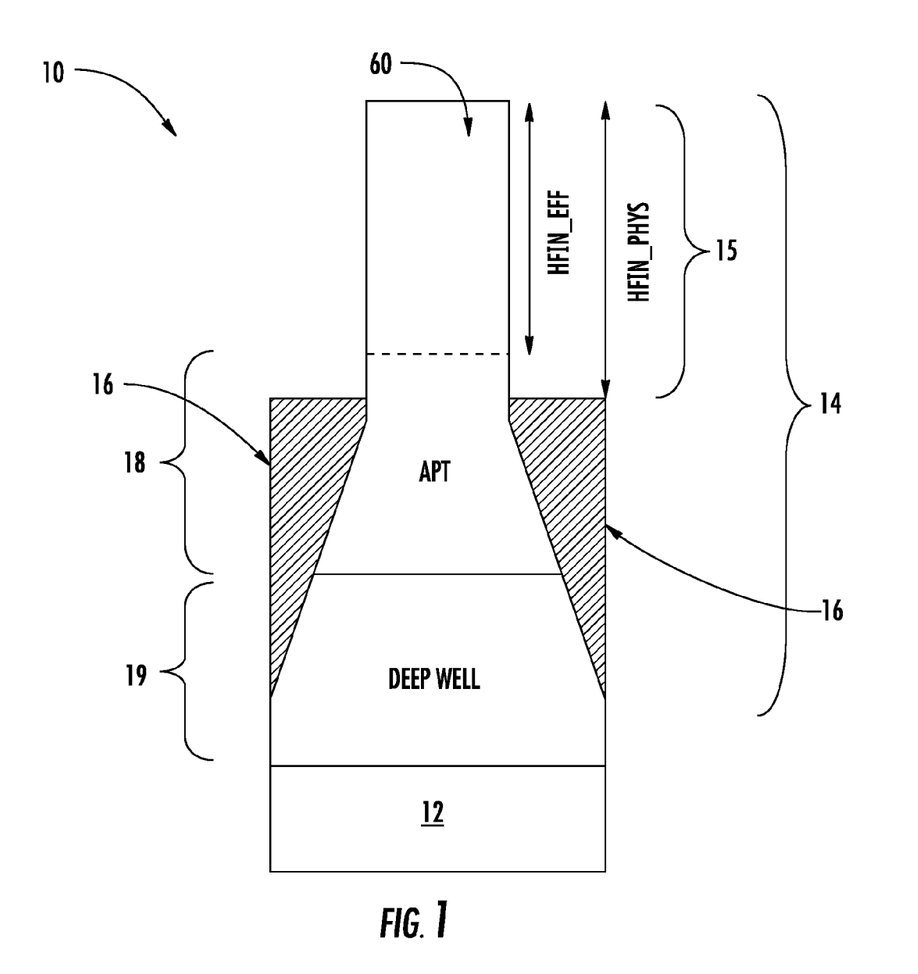
FIG. 1 illustrates a cross-section view of a semiconductor device according to a particular embodiment.

Now turning to FIG. 1 there is shown a cross-sectional view of an exemplary semiconductor device 10, before the formation of the gate, according to a particular embodiment. Semiconductor device 10 includes a fin structure 14 formed on a semiconducting substrate 12 by a combination of lithographic and etch processes. In the illustrated embodiment, semiconductor device 10 includes a channel region 60 formed in fin structure 14 by way of a substantially undoped semiconductor layer, overlying a heavily doped region 18 and, optionally, a well region 19. Adjacent to fin structure 14 on either side is isolation oxide 16. Semiconductor device 10 can operate at higher speeds and/or with reduced power consumption. As used herein, the term "semiconducting substrate" refers to any type of substrate or supporting layer having one or more layers of semiconducting materials disposed thereon. These can include silicon-on-insulator substrates, bulk silicon substrates, or epi-silicon substrates, to name a few.

As illustrated by FIG. 1 fin structure 14 is formed on semiconducting substrate 12. Substrate 12 in this embodiment represents a substrate of semiconductor material having a heavily doped layer 18 formed therein. Heavily doped layer 18 represents a layer of heavily concentrated doped semiconductor material ($5 \times 10^{18}$ to $10^{20}$ atom/cm$^3$). As shown in FIG. 1, this layer can be configured as an anti-punch through layer (APT).

Fin structure 14 represents a structure formed of semiconductor material on top of semiconducting substrate 12 that extends outward and/or upward from semiconducting substrate 12. In the particular configuration of FIG. 1, the fin structure 14 extends at least through the channel region and preferably through the heavily doped layer 18. In some configurations, the fin structure 14 can further extend through the well layer 19. As noted above, the fin structure 14 is formed preferably by depositing an epi-layer that is substantially undoped ($<10^{17}$ atoms/cm$^3$) and subsequently patterning to form the fin structure 14. In particular embodiments, the width of fin structure can be between 5 and 50 nm, such as 10 nm.

As noted above, channel region 60 also represents a region of fin structure 14. In particular, channel region 60 is formed from semiconductor material in fin structure 14 by defining a portion of fin structure 14 into which no types of impurities are added. As a result, channel region 60 defines a channel region that is substantially undoped.

Because channel region 60 is formed as a part of fin structure 14 extending from semiconducting substrate 12 and heavily doped layer 18, the gate (not shown) is be formed to abut channel region 60 along multiple boundaries, faces, sides, and/or portions of channel region 60. The gate is formed by first depositing or growing a layer of oxide at these boundaries. Then, preferably, a stack of metal is formed to provide a gate electrode. However, the various embodiments are not limited in this regard and other types of gate electrode materials can also be used.

Figure 2:
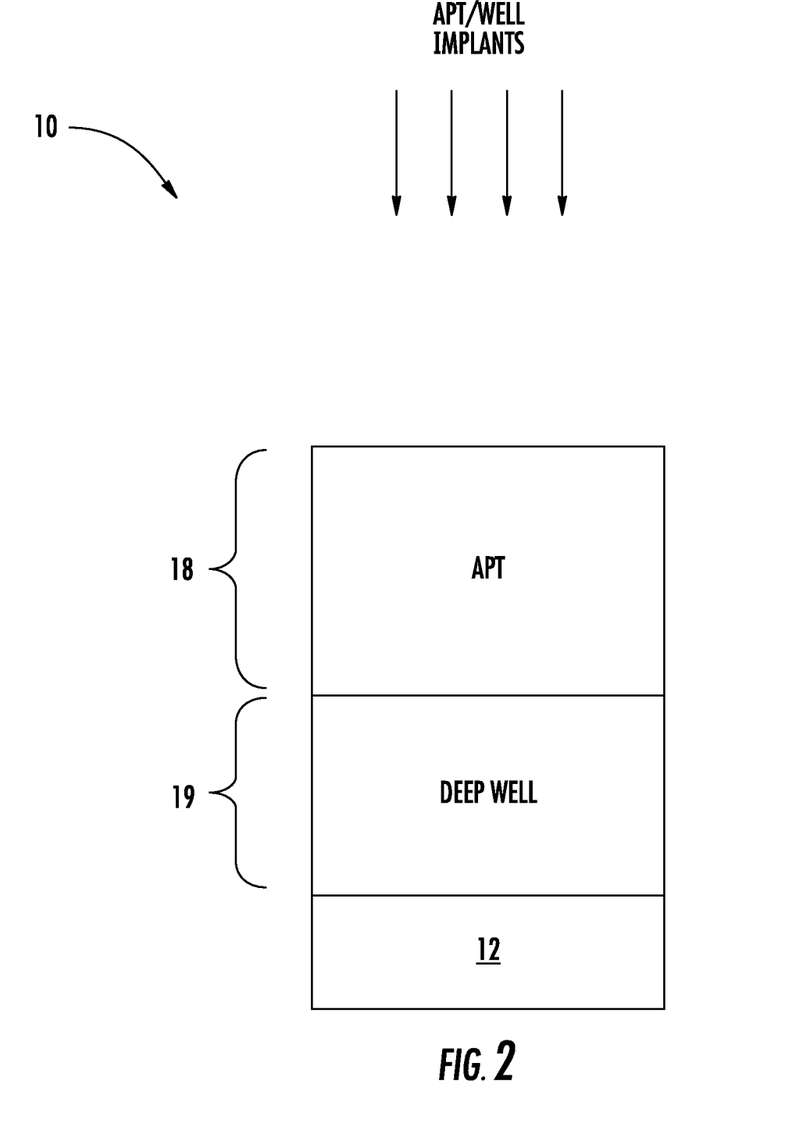
FIGS. 2-4 illustrate various steps in a method for fabricating the semiconductor device of FIG. 1.

As noted above, the heavily doped layer 18 (and well region 19) is formed prior to formation of isolation regions. Further, the heavily doped layer 18 can be formed in a variety of ways. In particular embodiments, the heavily doped layer 18 is formed by implanting appropriate species to form one or more heavily doped regions. Similarly, the well region 19 is formed by implanting appropriate species to form one or more well regions. This process is schematically illustrated in FIG. 2. In one exemplary process, the semiconducting substrate 12 is a p-type conductivity substrate. Then, p-type doping materials, such as boron (B), gallium (Ga), indium (In), or any other suitable p-type dopant, can be provided. In one exemplary process, a boron well implant(s) and additional boron implant(s) are provided. The implants can be configured to result in a p-type doping concentration at the surface between $5 \times 10^{18}$ to $1 \times 10^{20}$ atom/cm$^3$. Depending on the process conditions, additional implants can also be provided to limit the amount of B (or other p-type dopants) allowed to diffuse into the epi-layer during subsequent steps. For example, a Ge amorphization implant and a C+ implant can be utilized to provide a surface layer of substitutional C to reduce or eliminate B diffusion during subsequent processing steps. For another FinFET, n-type doping materials, such as antimony, arsenic, phosphorous, or any other appropriate n-type dopant, can be provided. For example, a phosphorous well implant(s) and an arsenic implant(s) can be provided. The implants can be layered to provide regions of differing dopant concentrations to achieve the electrical characteristics desired. Again, the implants can be selected to provide an n-type doping concentration at the surface between $5 \times 10^{18}$ to $1 \times 10^{20}$ atom/cm$^3$.

Figure 3:
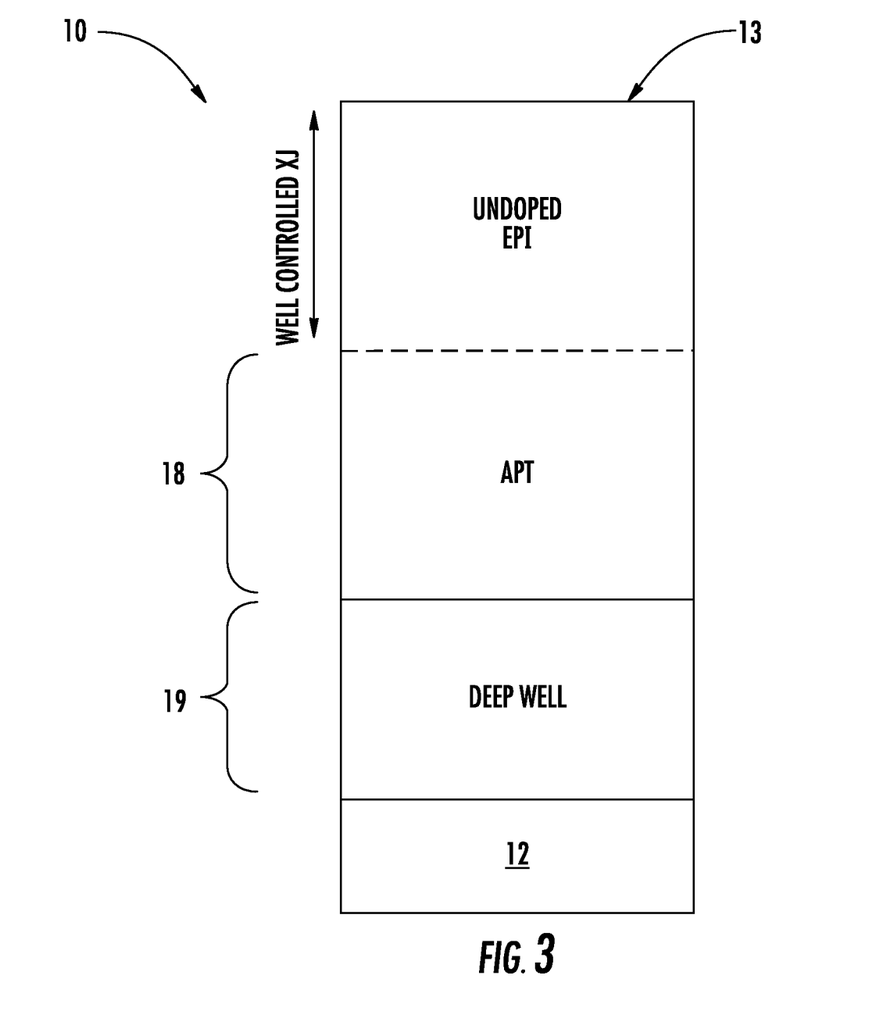

Following the formation of the heavily doped layer 18 and the well region 19, the undoped channel can be formed. FIG. 3 illustrates semiconducting substrate 12 after an epi-layer 13 of undoped semiconductor material has been formed on top of heavily doped layer 18. In a particular embodiment, the epi-layer 13 can be a layer of 30 nm to 40 nm of silicon. Epi-layer 13 will subsequently be used to form fin structure 14. The epi-layer 13 is formed on top of heavily doped layer 18 using any appropriate epitaxial growth techniques to deposit the epi-layer 13. In some embodiments, the semiconducting substrate 12 is a silicon-comprising substrate and the epi-layer 13 is a layer of silicon. In these embodiments, various chemical vapor deposition techniques can be used to form the epi-layer 13. These include ultra-high vacuum CVD, low pressure CVD, and remote plasma CVD, to name a few. However, the various embodiments are not limited in this regard and any other techniques for forming silicon epi-layer are equally applicable.

The present disclosure also contemplates that epi-layer 13 can be formed using other materials compatible with a silicon substrate. For example, epi-layer can be a layer of a silicon germanium alloy, a silicon germanium carbon alloy, a silicon carbon alloy, or a germanium carbon alloy. Further, the present disclosure also contemplates that the composition of the semiconducting substrate 12 and the epi-layer 13 are not limited to Column IV elements. Rather, the methods described herein and devices therefrom can be based on any other types of semiconductor materials without limitation.

Figure 4:
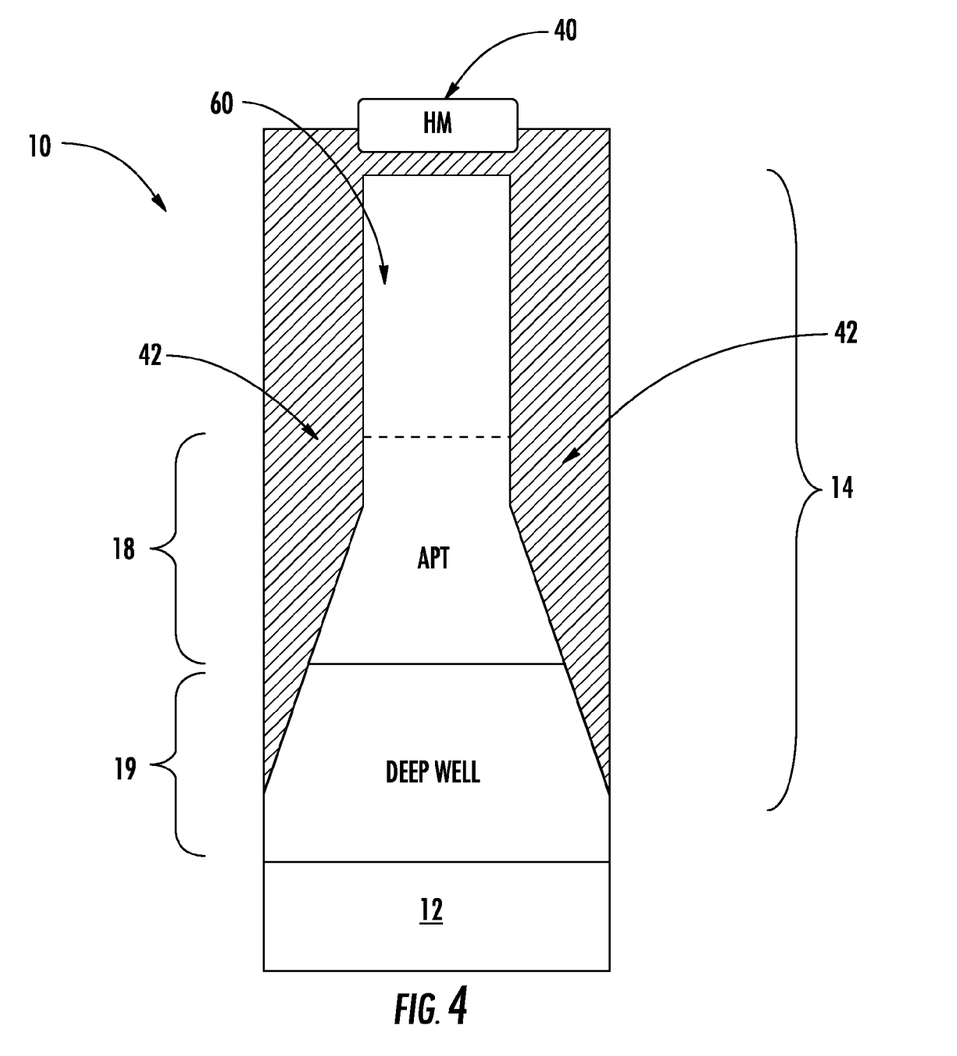

Referring now to FIG. 4, this illustrates a fin patterning process that is performed, in particular embodiments, after epi-layer 13 has been formed on top of heavily doped layer 18. A hard mask 40 is applied to appropriate portions of semiconducting substrate 12 to delineate fin structure 14. Mask 40 can comprise silicon oxide, silicon oxide nitride, silicon nitride layer, a combination of these materials, and/or any other appropriate material for protecting portions of epi-layer 13 directly below mask 40 from etching. After mask 40 has been applied, a layer of photoresist is applied on top of mask 40, and semiconducting substrate 12 is then be etched to form fin structure 14. Various processes such as optical lithography, immersion lithography, imprint lithography; direct write e-beam lithography, x-ray lithography, or extreme ultraviolet lithography can be used to define this pattern in the photoresist. An etch process, such as plasma etching, is then used to complete the patterning process to form fin structure 14. Any other etching processes can also be used in the various embodiments. Mask 40 can then be removed or retained for subsequent steps as appropriate based on the particular techniques being utilized.

As noted above, some processes for forming epi-layer 13 can provide variation in uniformity on the order of 0.5% or better. Accordingly, the thickness of the epi-layer 13 across the semiconducting substrate 12 is well-known. Further, selected etch processes can be used that provide high levels of uniformity as well. For example, a dry, plasma etch processes are available that provide 2-5 nm accuracy. Accordingly, the combination of these two levels of uniformity allows the etch process to accurately target an etch process that substantially achieves a desired thickness of the epi-layer 13 for the resulting fin.

Subsequent to etching process that forms the fin structure 14, an dielectric layer 42 is formed over the entire structure as a blanket film. In a particular embodiment, a silicon oxide is deposited using a chemical vapor deposition method at a temperature that is selected to avoid the dopants from heavily doped region 18 from migrating up into the channel 60. Thereafter, an etch process is used to remove a portion of the dielectric layer 42 down to a pre-selected level to define the isolation dielectric 16. Preferably, the etch process is configured to so that the top surface of the resulting isolation dielectric 16 is at or near the top surface of the heavily doped region 18, as illustrated in FIG. 1.

In some embodiments, prior to the etching of dielectric layer 42, a planarization etch or polish process can be performed as a first step so that the dielectric layer 42 can be removed to the level of the top surface of fin structure 14. Examples of suitable polish processes include chemical mechanical polishing or mechanical polishing. Then the etch can proceed through the vertical length of the fin structure 14 so that as a result, at least the undoped portion (channel 60) of the fin structure 14 is exposed, yielding an exposed fin structure 15, and the remainder of the fin structure 14 is surrounded by the isolation dielectric 16. After the dielectric 42 is etched, resulting in the exposure of channel 60, the gate structure can be formed (not shown) so that the gate materials (e.g., gate dielectric and gate electrode) wraps around the exposed surfaces of fin structure 14 (i.e., around exposed fin structure 15).

The result of this process is that the electrical height of the exposed fin structure 15 (i.e., the height of channel 60, represented by Hfin_eff) and the actual height of the exposed fin structure 15 are the same or substantially the same. As a result of the process described above, the portion of the exposed fin structure 15 associated with heavily doped layer 18 is relatively small. As a result, all undoped regions of channel 60 are under direct control of the gate structure subsequently formed. Further, even if some portions of heavily doped layer 18 are under control of the gate structure subsequently formed, the high doping therein will prevent this portion of fin structure 14 from significantly affecting operation of device 10.

The present disclosure also contemplates that the methodology described above can be utilized to allow planar CMOS and FinFET devices to be concurrently formed on the same substrate. Specifically, the methodology described above can be useful for integrating deeply depleted channel (DDC) transistor devices with FinFET devices. DDC transistor devices are amenable to the process flow described above, as they also use a substantially undoped layer for the channel formed on top of one or more highly doped layers.

DDC transistors are formed, for example, by forming a well for the CMOS devices by implanting dopants into a substrate to form a heavily doped screen layer ($5 \times 10^{18}$ to $1 \times 10^{20}$ atoms/cm$^3$). This can be followed by an undoped or slightly doped (collectively "substantially undoped") blanket epitaxial layer ($<5 \times 10^{17}$) deposited over the screen layer, extending across multiple die and transistor die blocks. Such a blanket epitaxial layer should be formed so as to reduce upward migration of scattered dopants emplaced during the well implant. In some configurations, lightly doped threshold voltage (Vth) adjustment layers (between $5 \times 10^{17}$ and $2 \times 10^{19}$ atoms/cm$^3$) can also be formed in or adjacent to the screen layer in order to allow finer adjustment of threshold voltage and control against unwanted leakage current. Preferably, conventional threshold voltage setting methods by way of channel implants or halo implants are not used in the fabrication of DDC transistors. However, other various embodiments exist.

Details regarding exemplary DDC transistor structures are more completely described in U.S. patent application Ser. No. 12/708,497 titled "ELECTRONIC DEVICES AND SYSTEMS, AND METHODS FOR MAKING AND USING THE SAME" and filed Feb. 18, 2010, U.S. patent application Ser. No. 12/971,884 titled "LOW POWER SEMICONDUCTOR TRANSISTOR STRUCTURE AND METHOD OF FABRICATION THEREOF" and filed Dec. 17, 2010, U.S. patent application Ser. No. 12/971,955 titled "TRANSISTOR WITH THRESHOLD VOLTAGE SET NOTCH AND METHOD OF FABRICATION THEREOF" and filed Dec. 17, 2010, U.S. patent application Ser. No. 12/895,785 titled "ADVANCED TRANSISTORS WITH THRESHOLD VOLTAGE SET DOPANT STRUCTURES" and filed Sep. 30, 2010, the disclosures of which are hereby incorporated by reference in their entirety, and U.S. patent application Ser. No. 12/895,813 titled "ADVANCED TRANSISTORS WITH PUNCH THROUGH SUPPRESSION" and filed Sep. 30, 2010.

Figure 5A:
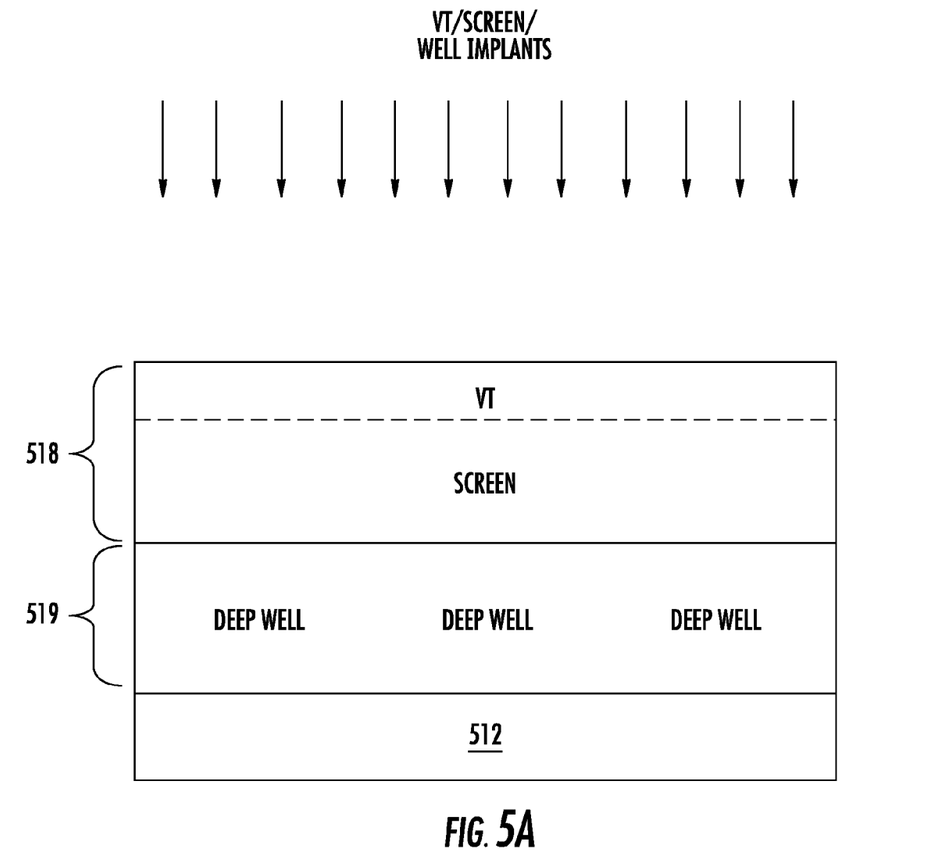
FIGS. 5A-5D illustrate various steps for forming FinFET and planar MOSFET devices on a same substrate in accordance with a particular embodiment.

Referring now to FIG. 5A, the process can first begin with formation of a heavily doped layer region 518 at the surface of semiconducting substrate 512. Optionally, a well region (not shown) can also be formed, as previously described. The heavily doped layer region 518 is for the to-be-formed FinFET device and for the to-be-formed DDC device. Although the doping concentration in the heavily doped region 518 can be selected for purposes of providing an adequate body for a FinFET, the doping concentration can also be selected for a CMOS device, such as a DDC device. For example, in the case of a DDC device, the heavily doped region 518 can be configured to provide a highly doped screening layer ("SCREEN" in FIGS. 5A-5D) and the Vth adjustment layer ("VT" in FIGS. 5A-5D) for the DDC device. The dopant levels and materials for the heavily doped layer region 518 are selected for each device, and may be the same or may differ. If the dopant levels and/or materials differ, then masking steps are used to block off areas for differential doping.

Figure 5B:
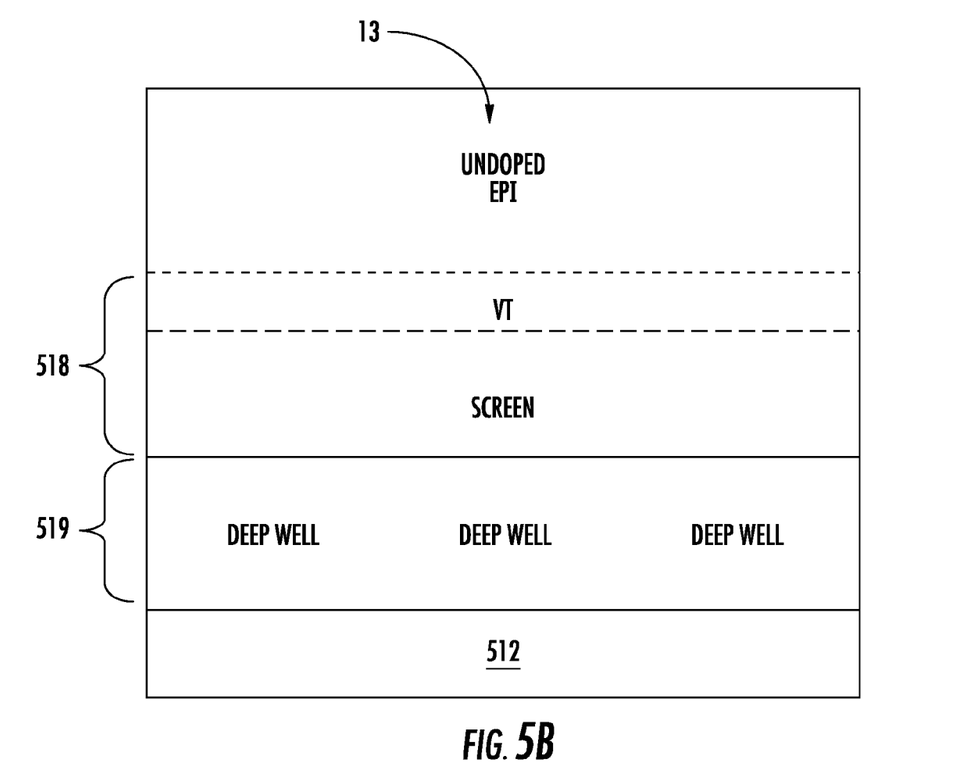
Figure 5C:
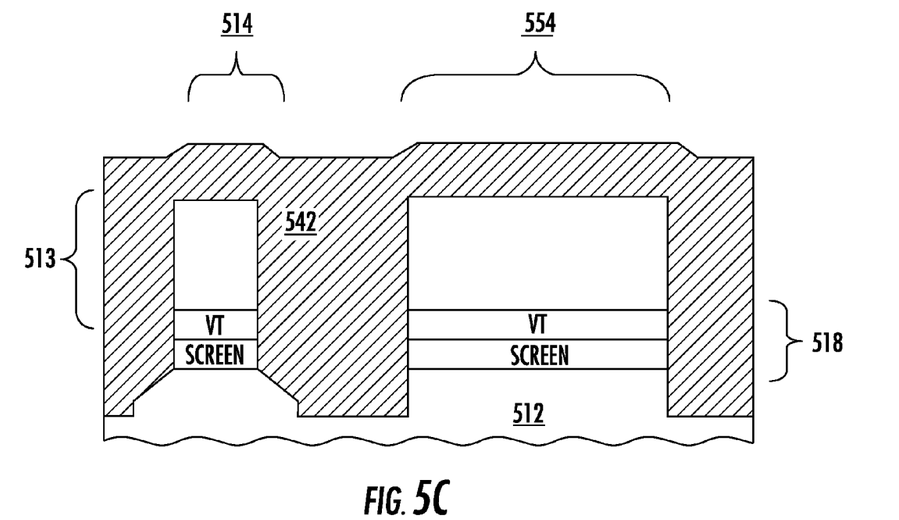

The substantially undoped epi-layer 513 can then be formed, as shown in FIG. 5B. The epi-layer 513 can be formed in substantially the same manner as previously described. Thereafter, the epi-layer 513 can be pattered, using lithography and etch steps, to simultaneously form structures 514 and 554, as shown in FIG. 5C. In the embodiment illustrated in FIG. 5C, structure 514 is a fin structure while structure 554 is a device island or an active area structure or region for forming planar devices thereon. In FIG. 5C, the well implants are not shown for ease of illustration. It is worth noting that the etching of the epi-layer 513 can also be utilized to define isolation features between the structures 514 and 554. Thus, the etch process can be configured so as to etch specific regions of the epi-layer 513, the underlying portions of the heavily doped region 518, and portions of semiconducting substrate 512.

Next, a dielectric 542 is deposited to cover over all of the etched portions. This can be performed, preferably, using chemical vapor deposition in a process that is below the maximum temperature to avoid dopants migrating up into the substantially undoped epi-layer 513. Then, the dielectric 542 is etched back to a desired depth to work as isolations for both the FinFET and the planar device to yield isolation dielectric 516. As a result of the etch of dielectric 542, the dielectric isolation 516 will be at a depth defining the bottom of an exposed fin structure 515, to be used to define a FinFET device(s), and will be aligned with an upper surface of the active area region 554 to provide isolation for the planar device(s) formed thereon.

Figure 5D:
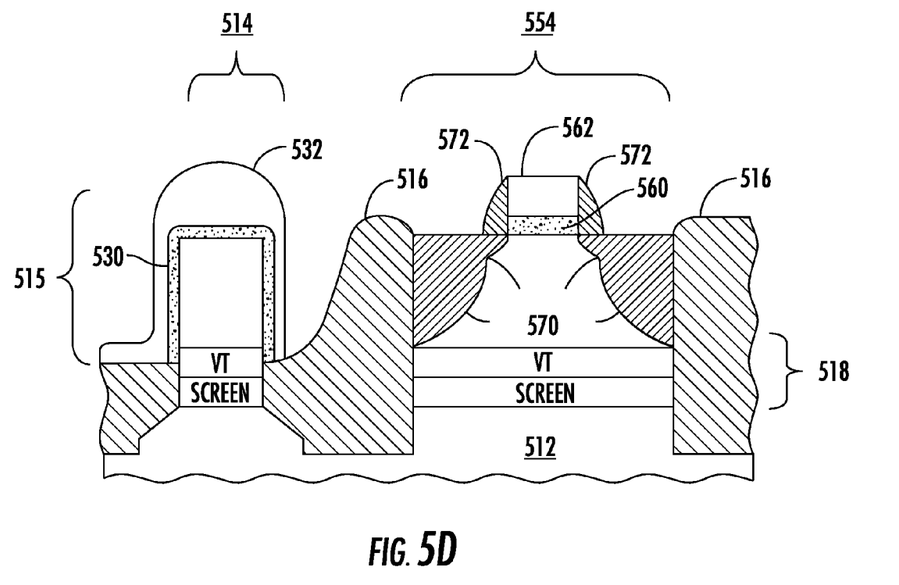

Additional processing can then be performed to form the planar and FinFET devices, as also shown in FIG. 5D. In particular, gate dielectric 530 is formed on the exposed sides of exposed fin structure 515. A gate dielectric 560 is also formed on the upper surface of the active area regions 554. The gate dielectrics 530 and 560 can be the same or different and can be formed using the same or different processes. Preferably, gate dielectrics 530 and 560 are both formed using a thermal oxidation process in a furnace, using a temperature suitable to avoid dopants from migrating up into the substantially undoped channel areas. Gate electrodes 532 and 562 for each device are then preferably formed from metal using a physical vapor deposition process. Materials can include TiN, Al alloys, W and other materials or combinations thereof to achieve a desired work function. For the planar device, gate electrode can be formed using a gate-first approach or gate-last approach. Additionally, source and drain regions 570 are formed for the planar device(s). In a particular embodiment, these regions can be formed via implants into the active area region 554. Such a process can include formation of spacer features 572 in the active area region 554, for source/drain extension implants.

The present disclosure also contemplates that additional process steps can be provided for the planar CMOS devices. For example, the channel region for the planar CMOS devices can require a higher doping concentration than the FinFET devices and therefore, additional doping steps would be used. In still another example, selective etching of the active area structure 554 can be performed prior to the formation of gate dielectric 560 and gate electrode 562 to reduce the thickness of the epi-layer for the planar CMOS devices.

The present disclosure also contemplates that following formation of the structure of FIG. 5C, the process flow can proceed in a bifurcated manner. That is, many or all of the processing steps for the different device types can be performed separately. This can be accomplished via the use of masking layers to prevent process steps from being performed on certain devices. For example, masking layers can be utilized to allow different processes and materials for the gate dielectric, the gate electrode, and device implants, to name a few. However, the various embodiments are not limited in this regard and any other processes for the different devices can also be bifurcated.

While various embodiments have been described above, it should be understood that they have been presented by way of example only, and not limitation. Numerous changes to the disclosed embodiments can be made in accordance with the disclosure herein without departing from the spirit or scope of the embodiments. Thus, the breadth and scope of the present invention should not be limited by any of the above described embodiments. Rather, the scope of the invention should be defined in accordance with the following claims and their equivalents.

Although the embodiments have been illustrated and described with respect to one or more implementations, equivalent alterations and modifications will occur to others skilled in the art upon the reading and understanding of this specification and the annexed drawings. In addition, while a particular feature of an embodiment may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A method of fabricating semiconductor devices, comprising:
   providing a silicon substrate;
   forming a heavily doped region at a surface of the silicon substrate in at least one area of the silicon substrate, the heavily doped region comprising at least one heavily doped layer, the at least one heavily doped layer having a doping concentration greater than a doping concentration of the silicon substrate and of a first conductivity type;
   forming an additional layer on the silicon substrate, the additional layer comprising a substantially undoped epitaxial silicon layer;

applying a first removal process to the silicon substrate to define at least one unetched portion and at least one etched portion in the at least one area, the at least one unetched portion defining at least one fin structure, and the at least one etched portion extending through at least the thickness of the additional layer and into the heavily doped layer;

forming a dielectric in the at least one etched portion with a thickness selected so that the additional layer in the at least one fin structure remains exposed; and forming a gate that wraps around the exposed surfaces of the at least one fin structure, wherein forming the heavily doped region comprises providing additional implants to provide a surface layer at the interface between the heavily doped region and the additional layer to prevent diffusion of dopants from the heavily doped region to the additional layer.

2. The method of claim 1, further comprising:

prior to applying the first removal process, providing a stop layer on the additional layer in a pattern corresponding to the at least one fin structure; and subsequent to applying the first removal process, depositing a blanket dielectric film on the silicon substrate, and wherein the forming of the dielectric comprises applying a planarization process to the semiconductor substrate so that a planarized surface of the blanket dielectric film coincides substantially with the stop layer and applying a second removal process to the semiconducting substrate that preferentially removes the blanket dielectric film over other materials.

3. The method of claim 1, wherein forming the heavily doped region comprises implanting at least one species for providing dopant atoms of the first conductivity type to a concentration of about $5 \times 10^{18}$ to $1 \times 10^{20}$ atoms/cm$^3$.

4. The method of claim 1, wherein the silicon substrate comprises one of a bulk silicon substrate, an epi substrate, or a silicon-on-insulator substrate.

5. A method of fabricating semiconductor devices, comprising:

providing a silicon substrate;

forming a heavily doped region at a surface of the silicon substrate in at least one area of the silicon substrate using ion implantation, the heavily doped region comprising at least one heavily doped layer, the at least one heavily doped layer having a doping concentration greater than a doping concentration of the semiconducting substrate and of a first conductivity type;

forming an additional layer of semiconductor material on the silicon substrate, the additional layer comprising a substantially undoped silicon-comprising epitaxial layer;

applying a first removal process to the silicon substrate to define at least one unetched portion and at least one etched portion in the at least one area, the at least one unetched portion defining at least one fin structure, and the at least one etched portion extending through at least a portion of the heavily doped region;

disposing at least one dielectric layer in the at least one etched portion, the thickness of the at least one dielectric layer selected to so that the upper surface of the at least one dielectric layer abuts the heavily doped region; and forming a gate in the at least fin structure to provide at least one FinFET device, wherein forming the heavily doped region comprises providing additional implants to provide a surface layer at the interface between the heavily doped region and the additional lam to prevent diffusion of dopants from the heavily doped region to the additional layer.

6. The method of claim 5, further comprising:

prior to applying the first removal process, providing a stop layer on the additional layer in a pattern corresponding to the at least one fin structure; and subsequent to applying the first removal process, depositing at least one blanket dielectric film on the silicon substrate, and wherein the disposing further comprises applying a planarization process to the silicon substrate so that a planarized surface of the at least one blanket dielectric film coincides substantially with the stop layer and applying a second removal process to the silicon substrate that preferentially removes a portion of the at least one blanket dielectric film over other materials to yield the at least one dielectric layer.

7. The method of claim 5, wherein forming the heavily doped region comprises implanting at least one species for providing dopant atoms of the first conductivity type.

8. The method of claim 5, wherein the silicon substrate comprises one of a bulk silicon substrate, an epi substrate, or a silicon-on-insulator substrate.

9. The method of claim 5, wherein substantially undoped silicon-comprising epitaxial layer comprises a substantially undoped silicon-comprising epitaxial layer.

10. A method of fabricating semiconductor devices, comprising:

providing a silicon substrate;

forming a heavily doped region at a surface of the silicon substrate in at least one area of the semiconducting substrate using ion implantation, the heavily doped region comprising at least one heavily doped layer, the at least one heavily doped layer having a doping concentration greater than a doping concentration of the semiconducting silicon substrate and of a first conductivity type;

forming an additional layer of semiconductor material on the silicon substrate, the additional layer comprising a substantially undoped epitaxial silicon layer;

applying a first removal process to the silicon substrate to define at least one first unetched portion, at least one second unetched portion, and at least one etched portion in the at least one area, the at least one first unetched portion defining at least one fin structure, the at least one second unetched portion defining at least one planar active area, and the at least one etched portion extending through at least through a portion of the heavily doped layer;

forming at least one dielectric layer in the at least one etched portion so that an upper surface of the at least one dielectric layer abuts the heavily doped region in the at least one fin structure and abuts an upper surface of the additional layer in the at least one planar active area; and forming a gate in the at least one fin structure to provide at least one FinFET device; and forming a gate in the at least one planar active region to provide at least one planar MOSFET device, wherein forming the heavily doped region comprises providing additional implants to provide a surface layer at the interface between the heavily doped region and the additional layer to prevent diffusion of dopants from the heavily doped region to the additional layer.

11. The method of claim 10, wherein the at least one etched portion extends through the heavily doped region.

12. The method of claim 10, further comprising:
prior to applying the first removal process, providing a stop layer on the additional layer in a pattern corresponding to the at least one fin structure and the at least one planar active area;
subsequent to applying the first removal process, depositing at least one blanket dielectric film on the silicon substrate; and
wherein the disposing comprises applying a planarization process to the silicon substrate so that a planarized surface of the at least one blanket dielectric film coincides substantially with the stop layer, forming a masking layer over the at least planar active area and adjoining portions of the planarized surface, and applying a second removal process to the silicon substrate that preferentially removes a portion of the at least one blanket dielectric film over other materials to yield the at least one dielectric layer.

13. The method of claim 10, wherein forming the heavily doped region comprises implanting at least one species for providing dopant atoms of the first conductivity type.

14. The method of claim 10, wherein forming the heavily doped region comprises implanting at least one species for providing at least one threshold voltage adjustment layer for the at least one planar MOSFET device.

* * * * *

UNITED STATES PATENT AND TRADEMARK OFFICE
CERTIFICATE OF CORRECTION

PATENT NO.         : 9,054,219 B1
APPLICATION NO.    : 14/173570
DATED              : June 9, 2015
INVENTOR(S)        : Thomas Hoffmann et al.

It is certified that error appears in the above-identified patent and that said Letters Patent is hereby corrected as shown below:

In the claims:

Column 10, Line 1: After "additional" and before "to prevent diffusion" delete "lam" and insert -- layer --.

Column 10, Line 37-38: After "concentration of the" and before "silicon substrate" delete "semiconducting".

Signed and Sealed this
Fifth Day of January, 2016

Michelle K. Lee
*Director of the United States Patent and Trademark Office*